United States Patent [19]

Koike

[11] Patent Number: 4,501,977

[45] Date of Patent: Feb. 26, 1985

[54] AND-OR LOGIC CIRCUIT INCLUDING A FEEDBACK PATH

[75] Inventor: Hideharu Koike, Yokohama, Japan

[73] Assignee: Tokyo Shibaura Denki Kabushiki Kaisha, Kawasaki, Japan

[21] Appl. No.: 446,772

[22] Filed: Dec. 3, 1982

[30] Foreign Application Priority Data

Dec. 7, 1981 [JP] Japan .................. 56-196571

[51] Int. Cl.$^3$ ................ H03K 19/017; H03K 19/096; H03K 19/177
[52] U.S. Cl. .................. 307/469; 307/452; 307/481; 364/716
[58] Field of Search .............. 307/443, 451, 452, 468, 307/469, 481, 576, 579, 585; 364/716

[56] References Cited

U.S. PATENT DOCUMENTS 3,943,377  3/1976  Suzuki ................. 307/443 X
4,040,015  8/1977  Fukuda ................ 307/452 X
4,330,722  5/1982  Sampson .............. 307/443

FOREIGN PATENT DOCUMENTS 2446654  4/1976  Fed. Rep. of Germany .
2544434  4/1977  Fed. Rep. of Germany .

OTHER PUBLICATIONS

ISSCC 81; pp. 230–231; Bernard T. Murphy et al., "A CMOS 32b Single Chip Microprocessor".

Primary Examiner—Stanley D. Miller
Assistant Examiner—David R. Hudspeth
Attorney, Agent, or Firm—Finnegan, Henderson, Farabow, Garrett & Dunner

[57] ABSTRACT

A plurality of logical product signals, from an AND circuit having a plurality of series circuits of transistors of a first conductivity type which selectively receive input signals, are selectively supplied to the gates of transistors of a second conductivity type which constitute an OR circuit and which are selectively connected in parallel between a power source and output signal lines. The AND and OR circuits are respectively controlled by synchronizing signals of opposite phases.

11 Claims, 10 Drawing Figures (a) $\bar{\phi}$
(b) xi
(c) yi (a) $\bar{\phi}$
(b) INPUT SIGNAL A~D
(c) OUTPUT SIGNAL GO1~GO3
(d) OUTPUT SIGNAL GO4, GO5

AND-OR LOGIC CIRCUIT INCLUDING A FEEDBACK PATH

BACKGROUND OF THE INVENTION

The present invention relates to a logic circuit of complementary metal oxide semiconductor type (to be referred to as CMOS hereinafter) and, more particularly, to an AND-OR circuit.

When a CMOS circuit is conventionally used to implement an AND-OR circuit of the synchronous type, a circuit as shown in FIG. 1 is used to decrease the number of circuit elements required. More specifically, an AND circuit TN1 comprises n-channel pulldown MOS transistors, one end of each being selectively connected to signal lines D1 to D4 while the other end of each is grounded through an n-channel pulldown MOS transistor Tr1. Logic signals A, $\overline{A}$, B, $\overline{B}$, C and $\overline{C}$ are selectively supplied to the gates of the n-channel MOS transistors so as to control their ON/OFF states. P-channel precharge MOS transistors Tr2 to Tr5 are connected between a power supply Vcc and the signal lines D1 to D4, respectively. A synchronizing signal $\overline{\phi 1}$ is supplied to the gates of the p-channel MOS transistors Tr2 to Tr5 to control their ON/OFF states and to simultaneously precharge the signal lines D1 to D4. The precharged signal lines D1 to D4 are kept charged or discharged by the n-channel pulldown MOS transistors which are selectively turned ON/OFF by the logic signals A, $\overline{A}$, B, $\overline{B}$, C and $\overline{C}$. Thus, the signal lines D1 to D4 are set at potentials DA1 to DA4 which correspond to the logical products of predetermined combinations of the input logic signals A, $\overline{A}$, B, $\overline{B}$, C and $\overline{C}$. The signals or potentials DA1 to DA4 of the signal lines D1 to D4 are selectively supplied to the gates of n-channel MOS transistors constituting an OR circuit TN2 so as to control the ON/OFF states of these n-channel transistors. One end of each of the n-channel MOS transistors constituting the OR circuit TN2 is selectively connected to a signal line E1, E2 or E3, and the other end of each MOS transistor is commonly grounded through an n-channel pulldown MOS transistor Tr6 whose gate is connected to receive a synchronizing signal $\overline{\phi 2}$. P-channel precharge MOS transistors Tr7 to Tr9 are connected between the power supply Vcc and the signal lines E1 to E3. The ON/OFF states of the p-channel transistors Tr7 to Tr9 are controlled by the synchronizing signal $\overline{\phi 2}$ supplied to their gates. The signal lines E1 to E3 are charged or discharged in accordance with the ON/OFF states of the n-channel MOS transistors constituting the OR circuit TN2. Potentials E01 to E03 which correspond to the AND-OR values for the predetermined combinations of the input signals A, $\overline{A}$, B, $\overline{B}$, C and $\overline{C}$ are produced from these signal lines E1 to E3, respectively.

The mode of operation of the circuit of FIG. 1 will now be described with reference to the timing charts shown in FIGS. 2(a) to 2(e). When the synchronizing signal $\overline{\phi 1}$ is shown in FIG. 2(a) is at a logic level "0", the n-channel MOS transistor Tr1 is turned OFF and the p-channel MOS transistors Tr2 to Tr5 are turned ON. The power supply voltage Vcc is supplied to the signal lines D1 to D4 through the p-channel MOS transistors Tr2 to Tr5, respectively to precharge the signal lines D1 to D4. When the synchronizing signal $\overline{\phi 1}$ goes to a logic level "1", the n-channel MOS transistor Tr1 is turned ON while the p-channel MOS transistors Tr2 to Tr5 are turned OFF. When the input logic signals A, $\overline{A}$, B, $\overline{B}$, C and $\overline{C}$ are supplied to the gates of the n-channel MOS transistors while the signal $\overline{\phi 1}$ is kept at a "0" logic level, these n-channel MOS transistors are selectively turned ON or OFF. If at least one transistor connected to one of the signal lines D1 to D4 is in the ON state, the charge on this signal line is discharged to logic level "0". On the other hand, if all the transistors connected to one of the signal lines D1 to D4 are in the OFF state, this signal line is held at the precharged potential (logic level "1"). Therefore, the logic signals DA1 to DA4 on the signal lines D1 to D4, respectively, are obtained as follows: "DA1 = A·B·C", "DA2 = A·$\overline{B}$·C", "DA3 = A·$\overline{B}$·C", and "DA4 = $\overline{A}$·$\overline{B}$·$\overline{C}$". When the synchronizing signal $\overline{\phi 2}$, shown in FIG. 2(b), is at a logic level "0", the p-channel MOS transistors Tr7 to Tr9 are turned ON. The power supply voltage Vcc is supplied to the signal lines, E1 to E3, through the p-channel MOS transistors Tr7 to Tr9, respectively, to precharge the signal lines E1 to E3. The signal lines D1 to D4 are selectively connected to the gates of the n-channel MOS transistors in the OR circuit TN2 so that the conduction states of these n-channel MOS transistors may be determined in accordance with the signals on the signal lines D1 to D4. If at least one of the n-channel MOS transistors in the OR circuit TN2, which are connected to the same signal line of the signal lines E1, E2 and E3, is in the ON state, the signal line is discharged to a logic level "0" when the synchronizing signal $\overline{\phi 2}$ is set at a "1" level. If all of the transistors connected to the same signal line are in the OFF state, this signal line goes to a logic level "1". Therefore, logic signals E01, E02 and E03 of the signal lines E1, E2 and E3, respectively, are as follows: "$\overline{E01}$ = DA1 + DA3 + DA4", "$\overline{E02}$ = DA2 + DA4", and "$\overline{E03}$ = DA1 + DA2 + DA3". Therefore, the output logic signals E01, E02 and E03 for the input logic signals A, $\overline{A}$, B, $\overline{B}$, C, $\overline{C}$ become as follows:

$\overline{E01}$ = A·B·C + A·$\overline{B}$·C + $\overline{A}$·$\overline{B}$·$\overline{C}$
$\overline{E02}$ = A·$\overline{B}$·$\overline{C}$ + $\overline{A}$·$\overline{B}$·$\overline{C}$
$\overline{E03}$ = A·B·C + A·$\overline{B}$·$\overline{C}$ + A·$\overline{B}$·C When the input logic signals A and C are at a logic level "1" and the input logic signal B is at a logic level "0" as shown in FIG. 2(c), all of the transistors, one end of each being connected to the signal line D3 are turned OFF. Therefore, the signal line D3 is held at the precharged level of "1". However, since at least one of the transistors which have one end commonly connected to one of the signal lines D1, D2 and D4 is turned ON, the charge on the signal lines D1, D2 and D4 is discharged through the n-channel MOS transistor Tr1. The potentials DA1, DA2 and DA4 of the signal lines D1, D2 and D4, respectively, are kept at a logic level "0", as shown in FIG. 2(d). The ON/OFF states of the n-channel MOS transistors of the OR circuit TN2, the gates of which are selectively connected to the signal lines D1 to D4, are controlled by the potentials DA1 to DA4. Since two transistors whose conduction states are controlled by the signal line D3 and which have one end connected to the respective signal lines E1 and E3 are in the ON state, the signal lines E1 and E3 are discharged to a logic level "0". Since all of the transistors connected to the signal line E2 are in the OFF state, the signal line E2 is held at the precharged level of "1", as shown in FIG. 2(e).

However, with the circuit of the configuration as described above, synchronizing signals having two different phases are required, and a circuit to generate such synchronizing signals is complex. Furthermore, after a plurality of logical products are obtained in response to the first synchronizing signal $\overline{\phi 1}$, logical sums of these logical products are obtained at the timing of the second synchronizing signal $\phi 2$. For this reason, the operating speed is decreased.

SUMMARY OF THE INVENTION

It is an object of the present invention to provide a logic circuit which is capable of operating in response to synchronizing signals which are opposite in phase, so that the circuit construction can be made simple and high speed operation can be attained.

According to an aspect of the present invention, there is provided a logic circuit comprising an AND circuit having a plurality of series circuits of transistors of a first conductivity type which selectively receive input signals; an OR circuit having transistors of a second conductivity type which are selectively connected in parallel with each other between a power supply terminal and output signal lines and which selectivity receive a plurality of logical products from the AND circuit; and means for controlling the AND circuit and the OR circuit by synchronizing signals of opposite phases.

According to the configuration as described above, since the operations of the AND circuit and of the OR circuit can be controlled in synchronism with logic signals which are opposite in phase, the logic circuit is capable of producing an AND-OR output at a high speed with a relatively simple configuration.

DETAILED DESCRIPTION OF THE PREFERRED EMBODIMENTS

Figure 3:
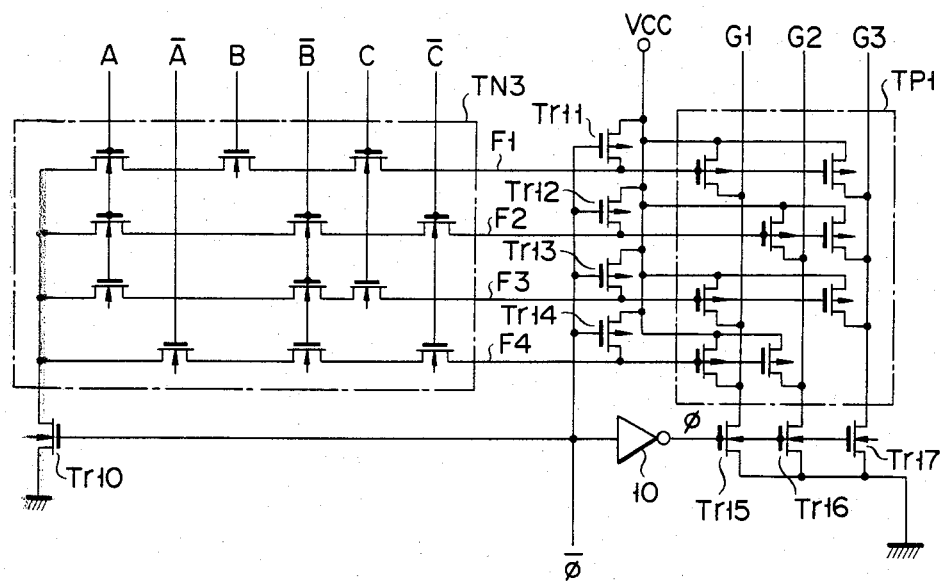
FIG. 3 is a circuit diagram of a logic circuit according to one embodiment of the present invention.

FIG. 3 shows a logic circuit according to one embodiment of the present invention. An AND circuit TN3 includes a plurality of series circuits of n-channel (first conductivity type) MOS transistors which receive input logic signals A, $\overline{A}$, B, $\overline{B}$, C and $\overline{C}$. One end of each of the series circuits is grounded through an n-channel pulldown MOS transistor Tr10 (first pulldown circuit). The other ends of the series circuits are respectively connected to signal lines F1 to F4. One end of each of the p-channel (second conductivity type) MOS transistors Tr11 to Tr14, constituting a precharge circuit, is connected to signal lines F1 to F4, respectively. The other ends of these transistors Tr11 to Tr14 are commonly connected to a power supply Vcc. A synchronizing signal $\overline{\phi}$ is supplied to the gate of the n-channel pulldown MOS transistor Tr10 and the gate of each of the p-channel MOS transistors Tr11 to Tr14 so as to control their pulldown and precharge operations, respectively. A plurality of AND outputs from the signal lines F1 to F4 are selectively supplied to the gates of the p-channel MOS transistors of an OR circuit TP1, which are connected in parallel between the power supply terminal Vcc and the output signal lines G1 to G3, thereby controlling the ON/OFF states of these p-channel transistors. The output signal lines G1 to G3 are connected to ground through the n-channel MOS transistors Tr15 to Tr17 (second pulldown circuit), respectively. A synchronizing signal $\phi$ is also supplied to the n-channel MOS transistors Tr15 to Tr17 from the inverter 10 so as to control their ON/OFF states.

Figure 1:
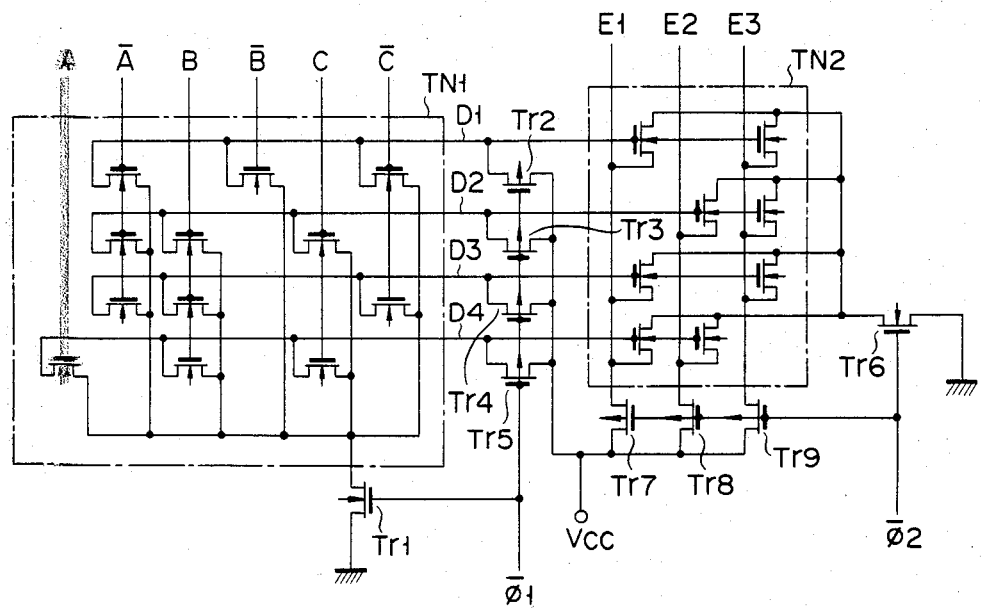
FIG. 1 is a circuit diagram of a conventional logic circuit.
Figure 2:
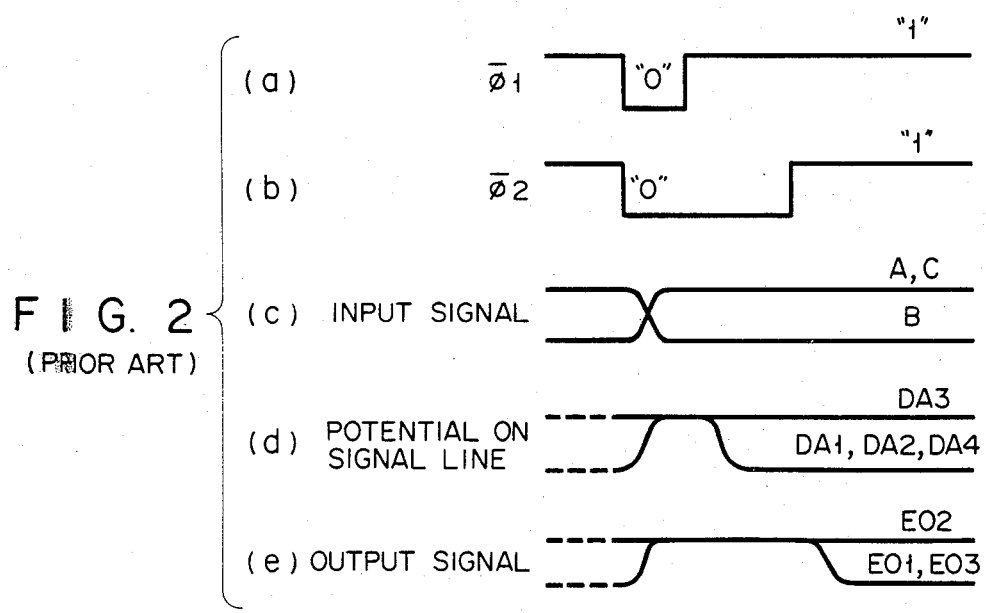
FIGS. 2(a) to 2(e) are timing charts for explaining the mode of operation of the logic circuit shown in FIG. 1.
Figure 4:
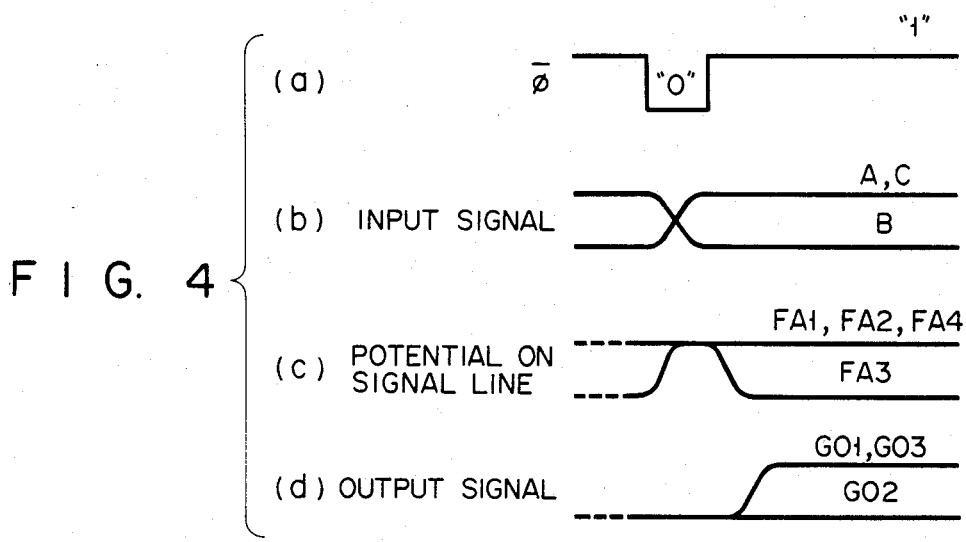
FIGS. 4(a) to 4(d) are timing charts for explaining the mode of operation of the logic circuit shown in FIG. 3.

The mode of operation of the logic circuit shown in FIG. 3 will now be described with reference to the timing charts shown in FIGS. 4(a) to 4(d). When the synchronizing signal $\overline{\phi}$ goes from a logic level "1" to a logic level "0" as shown in FIG. 4(a), the signal lines F1 to F4 are precharged with the power supply voltage Vcc which is supplied through the p-channel MOS transistors Tr11 to Tr14. When the synchronizing signal $\overline{\phi}$ goes from a logic level "0" to a logic level "1" after a predetermined period of time, the p-channel MOS transistors Tr11 to Tr14 are turned OFF while the n-channel MOS transistor Tr10 is turned ON. When the input logic signals A and C are at a logic level "1" and the input logic signal B is at a logic level "0" as shown in FIG. 4(b) while the signal $\phi$ is kept at a logic level "0", a signal line among the signal lines F1 to F4 which is connected to the series circuit of transistors which are all ON is discharged to a logic level "0". On the other hand, a signal line among the signal lines F1 to F4 which is connected to a series circuit of transistors at least one of which is in the OFF state is held at the precharged potential (logic level "1"). Therefore, logic signals FA1 to FA4 of the signal lines F1 to F4, respectively, are as follows: "$\overline{FA1}=A\cdot B\cdot C$", "$\overline{FA2}=A\cdot \overline{B}\cdot \overline{C}$", "$\overline{FA3}=A\cdot \overline{B}\cdot C$", and "$\overline{FA4}=\overline{A}\cdot \overline{B}\cdot \overline{C}$". The ON/OFF states of the p-channel MOS transistors of the OR circuit TP1 are controlled in accordance with the potentials FA1 to FA4 of the signal lines F1 to F4, respectively. A signal line among the output signal lines G1 to G3 which is connected to transistors which are all OFF goes to a logic level "0", and a signal line among the signal lines G1 to G3 which is connected to at least one transistor in the ON state goes to a logic level "1". In this case, potentials G01 to G03 of the output signal lines G1 and G3, respectively are at a logic level "1", while the potential G02 of the output signal line G2 is at a logic level "0". Thus, "$G01=\overline{FA1}+\overline{FA3}+\overline{FA4}$", "$G02=\overline{FA2}+\overline{FA4}$, and $G03=\overline{FA1}+\overline{FA2}+\overline{FA3}$". The output logic signals G01, G02, and G03 for the input logic signals A, $\overline{A}$, B, $\overline{B}$, C and $\overline{C}$ become as follows:

$G01=A\cdot B\cdot C+A\cdot \overline{B}\cdot C+\overline{A}\cdot \overline{B}\cdot \overline{C}$
$G02=A\cdot \overline{B}\cdot \overline{C}+\overline{A}\cdot \overline{B}\cdot \overline{C}$
$G03=A\cdot B\cdot C+A\cdot \overline{B}\cdot \overline{C}+A\cdot \overline{B}\cdot C$ The output signals from the logic circuit of this configuration are inverted signals of the output signals from the logic circuit shown in FIG. 1 and described above. Therefore, in order to obtain the same output signals as those obtainable with the logic circuit shown in FIG. 1, inverter circuits may be connected to the output ends of the output signal lines G1 to G3 to invert the respective output signals G01 to G03.

With the logic circuit of the configuration as described above, since a synchronizing signal need have only one phase, the time conventionally required for synchronizing the synchronizing signals having two different phases is eliminated. Therefore, the operating speed of the circuit is improved, and a circuit for generating the synchronizing signal can be simplified.

The present invention is not limited to the particular embodiment described above. Since a logic circuit according to the present invention operates in response to synchronizing signals which are in inverted relationship or in opposite phases, a complex logic operation may be obtained with a circuit of relatively simple configuration if the output signals are supplied to a logic circuit which is operated in synchronism with the same synchronizing signal.

Figure 5:
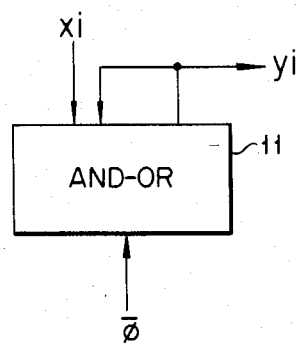
FIG. 5 is a block diagram of a logic circuit according to another embodiment of the present invention.
Figure 6:
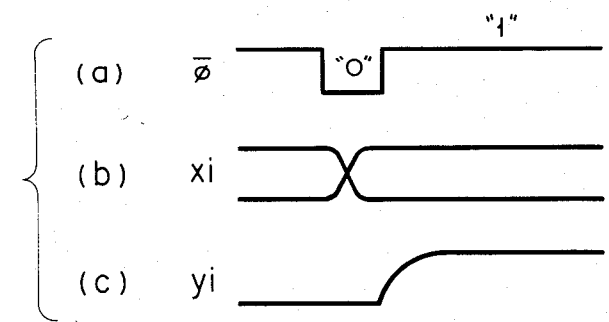
FIGS. 6(a) to 6(c) are timing charts for explaining the mode of operation of the logic circuit shown in FIG. 5.

FIG. 5 shows a schematic view of such a logic circuit, and FIGS. 6(a) to 6(c) show the timing charts for the respective signals. Referring to these figures, the reference symbol 11 denotes an AND-OR circuit; xi, an input signal; yi, an output signal; and $\phi$, a synchronizing signal.

Figure 7:
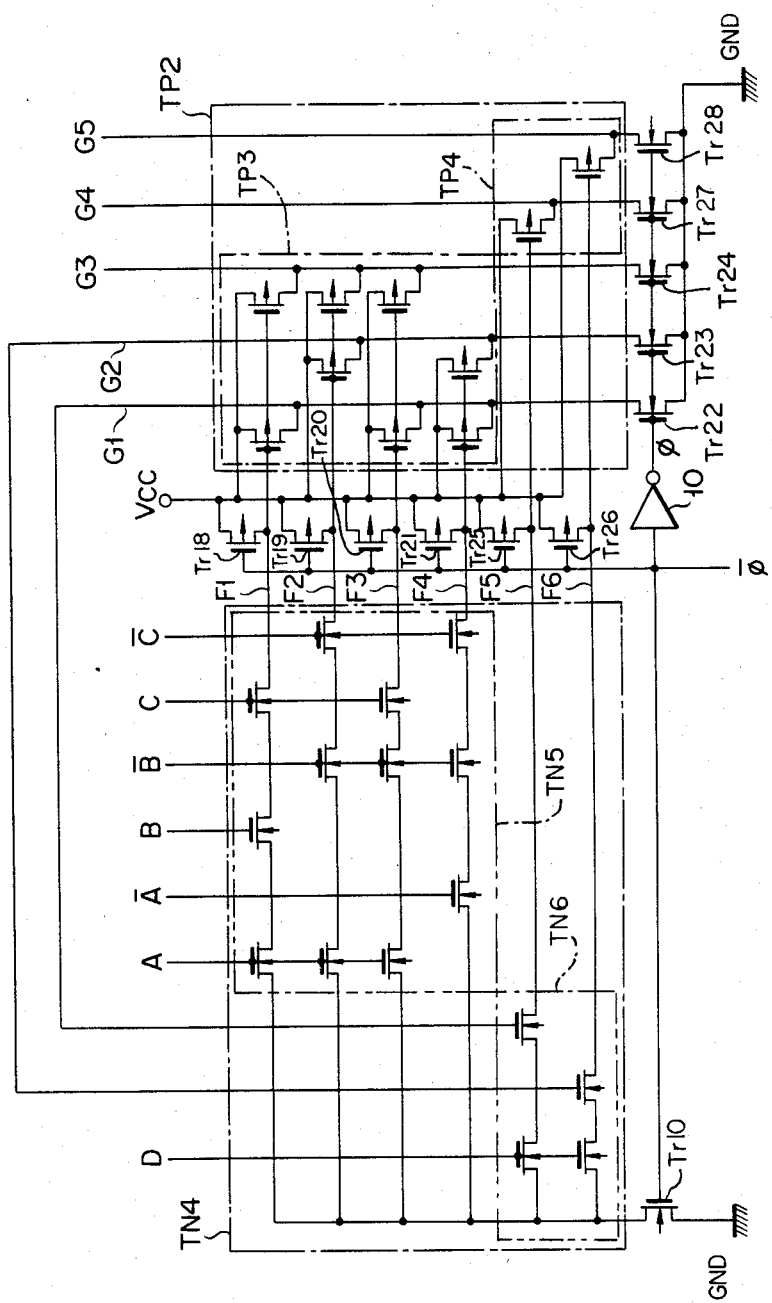
FIG. 7 is a detailed circuit diagram of the logic circuit shown in FIG. 5.

FIG. 7 shows the logic circuit of FIG. 5 in more detail. This circuit is the combination of the circuit of FIG. 3 and a feedback circuit. This is, an AND circuit TN4 is comprised of two AND circuits TN5 and TN6. An OR circuit TP2 consists of two OR circuits TP3 and TP4. Logic signals A, $\overline{A}$, B, $\overline{B}$, C and $\overline{C}$ are selectively supplied from an external circuit to the N-channel MOS transistors forming the AND circuit TN5. In the AND circuit TN5, a precharge circuit formed of P-channel MOS transistors Tr18–Tr21 precharges signal lines F1–F4 in synchronism with a first synchronizing signal $\phi$. The signal lines F1–F4 are pulled down also in synchronism with the first synchronizing signal $\phi$ by a pull-down circuit made of an N-channel MOS transistor Tr10. The output from the AND circuit TN5 is supplied through the signal lines F1–F4 to the P-channel MOS transistors forming the OR circuit TP3. The OR circuit TP3 is precharged with the power source voltage Vcc. Signal lines G1, G2 and G3 are pulled down in synchronism with a second synchronizing signal $\overline{\phi}$ which is opposite in phase to the first synchronizing signal $\phi$ by a pull-down circuit formed of N-channel MOS transistors Tr22, Tr23 and Tr24. The output from the OR circuit TP3 is input through the signal lines G1 and G2 to the N-channel Transistors forming the AND circuit TN6. The OR circuit TP3 also outputs a logical signal G03 through the signal line G3. A signal D is supplied from an external circuit to the AND circuit TN6. The signal lines F5, F6 of the AND circuit TN6 are precharged in synchronism with the first synchronizing signal $\phi$ by a precharge circuit comprising P-channel MOS transistors Tr25 and Tr26 and are pulled down in synchronism with the first synchronizing signal $\overline{\phi}$ by the pull-down circuit made of the N-channel MOS transistor Tr10. The output from the AND circuit TN6 is input through signal lines F5, F6 to the N-channel MOS transistors forming the OR circuit TP4. The OR circuit TP4 is precharged with the power source voltage Vcc. The signal lines G4 and G5 are pulled down in synchronism with the second synchronizing signal $\overline{\phi}$ by a pull-down circuit comprised of N-channel MOS transistors Tr27 and Tr28. The OR circuit TP4 generates logic signals G04 and G05, which are output through the signal lines G4, G5. G04=G01·D, and G05=G02·D.

Figure 8:
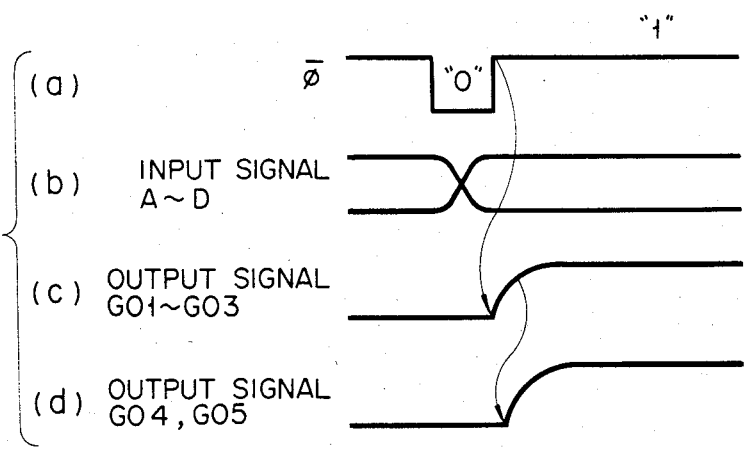
FIGS. 8(a) to 8(d) are timing charts for explaining the mode of operation of the logic circuit of FIG. 7.

FIGS. 8(a)–8(d) forming a timing chart show how the circuit of FIG. 7 operates. As shown in FIGS. 8(a) and 8(b), the logic input signals A, $\overline{A}$, B, $\overline{B}$, C, $\overline{C}$ and D are input to the circuit. Then, as shown in FIG. 8(c), AND-OR signals G01, G02 and G03 are output through the signal lines G1, G2 and G3. Upon the lapse of a predetermined time, AND-OR signals G04 and G05 obtained by processing the input signal D and AND-OR signals G01 and G02 are output through the signal lines G4, G5 as illustrated in FIG. 8(d). These signals G04 and G05 are obtained within the one-cycle period of the synchronizing signal $\overline{\phi}$.

Figure 9:
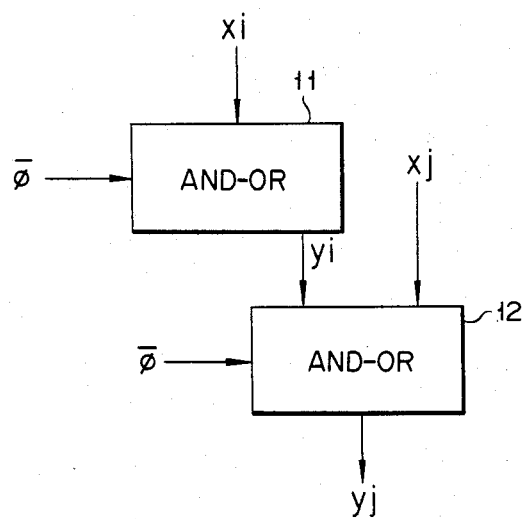
FIG. 9 is a block diagram of a logic circuit according to still another embodiment of the present invention.
Figure 10:
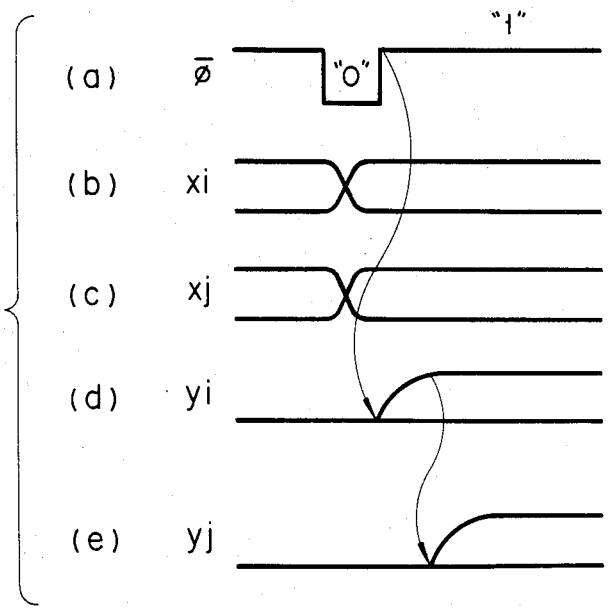
FIGS. 10(a) to 10(e) are timing charts for explaining the mode of operation of the logic circuit of FIG. 9.

FIG. 9 shows still another embodiment of the present invention, wherein an output signal from a first AND-OR circuit 11 is supplied as part of the input to a second AND-OR circuit 12.

When input signals xi and xj are supplied during the logic level "0" period of the synchronizing signal $\phi$ and the synchronizing signal $\phi$ is set to a logic level "1", as shown by the timing charts illustrated in FIGS. 10(a) to 10(e), then an output yi from the first AND-OR circuit 11 is first obtained, and an output yj from the second AND-OR circuit 12 is obtained after a predetermined time delay.

With the circuit of the configuration as described above, a complex logic output may be obtained by synchronizing a plurality of AND-OR circuits with synchronizing signals which are opposite in phase. If a circuit as shown in FIG. 9 is to be realized with the conventional circuit as shown in FIG. 1, a synchronizing signal is required for each logic circuit. This results in a complex configuration of a circuit for generating such synchronizing signals. Moreover, since conventionally a first logic operation is effected in a first logic circuit, which is controlled by a first synchronizing signal, and then a second logic operation is effected in a second logic circuit which is controlled by a second synchronizing signal, the operating speed is made significantly low.

What is claimed is:

1. An AND-OR logic circuit having two power supply terminals and an output signal line, comprising:
    a first AND circuit having a plurality of series circuits which comprise transistors of a first conductivity type coupled in series along their current conduction paths and which respectively receive input signals at their respective control electrodes;
    a first OR circuit having transistors of a second conductivity type which have their current conduction paths selectively connected in parallel to each other between one of said power supply terminals and said output signal line and selectively receive AND signals from said series circuits at their respective control electrodes;
    a second AND circuit having a plurality of series circuits which comprise transistors of the first conductivity type connected in series along their current conduction paths and which selectively receive at least two output signals from said first OR circuit at their respective control electrodes;
    a second OR circuit having transistors of the second conductivity type which have their current conduction paths selectively connected in parallel to each other between one of said power supply terminals and said output signal line and selectively receive AND signals from said series circuits of said second AND circuit at their respective control electrodes;

a precharge circuit connected between one end of each of said series circuits of said first and second AND circuits and one of said power supply terminals;

a first pull-down circuit connected between the other end of each of said series circuits of said first and second AND circuits and the other of said power supply terminals;

a second pull-down circuit coupled between one end of said output signal line and other of said power supply terminals; and a control means for controlling said precharge circuit and said first pull-down circuit with a first synchronizing signal and said second pull-down circuit with a second synchronizing signal of the substantially opposite phase to said first synchronizing signal.

2. An AND-OR logic circuit according to claim 1, wherein said second AND circuit has a transistor connected in series to the transistors forming the second AND circuit, said transistor selectively receiving a signal from an external circuit.

3. An AND-OR logic circuit according to claim 1, wherein the transistors of said first and second AND circuits and the transistors of said first and second OR circuits are MOS transistors.

4. An AND-OR logic circuit according to claim 1, wherein said first pull-down circuit comprises an MOS transistor of the first conductivity type which is connected between the other of said power supply terminals and said one end of each of said series circuits, and whose conduction state is controlled by one of said synchronizing signals.

5. An AND-OR logic circuit according to claim 1, wherein said precharge circuit comprises MOS transistors of the second conductivity type, each of which is connected between one of said power supply terminals and the other end of said respective series circuits, and whose conduction states are controlled by one of said synchronizing signals.

6. An AND-OR logic circuit according to claim 1, wherein said second pull-down circuit comprises MOS transistors of the first conductivity type which are connected between the other of said power supply terminals and said output signal line and whose conduction states are controlled by the other of said synchronizing signals.

7. An AND-OR logic circuit having two power supply terminals and an output signal line, comprising:

a first AND circuit having a plurality of series circuits which comprise transistors of a first conductivity type coupled in series along their current conduction paths and which respectively receive input signals at their respective control electrodes;

a first OR circuit having transistors of a second conductivity type which have their current conduction paths selectively connected in parallel to each other between one of said power supply terminals and said output signal line and selectively receive AND signals from said series circuits at their respective control electrodes;

a second AND circuit having a plurality of series circuits which comprise transistors of the first conductivity type connected in series along their current conduction paths and which selectively receive at least one output signal from said first OR circuit and an input signal from an external circuit at their respective control electrodes;

a second OR circuit having transistors of the second conductivity type which have their current conduction paths selectively connected in parallel to each other between one of said power supply terminals and said output signal line and selectively receive AND signals from said series circuits of said second AND circuit at their respective control electrodes;

a precharge circuit connected between one end of each of said series circuits of said first and second AND circuits and one of said power supply terminals;

a first pull-down circuit connected between the other end of each of said series circuits of said first and second AND circuits and the other of said power supply terminals;

a second pull-down circuit coupled between one end of said output signal line and the other of said power supply terminals; and a control means for controlling said precharge circuit and said first pull-down circuit with a first synchronizing signal and said second pull-down circuit with a second synchronizing signal of the substantially opposite phase to said first synchronizing signal.

8. An AND-OR logic circuit according to claim 7, wherein the transistors of said first and second AND circuits and the transistors of said first and second OR circuits are MOS transistors.

9. An AND-OR logic circuit according to claim 7, wherein said first pull-down circuit comprises an MOS transistor of the first conductivity type which is connected between the other of said power supply terminals and said one end of each of said series circuits, and whose conduction state is controlled by one of said synchronizing signals.

10. An AND-OR logic circuit according to claim 7, wherein said precharge circuit comprises MOS transistors of the second conductivity type, each of which is connected between one of said power supply terminals and the other end of said respective series circuits, and whose conduction states are controlled by one of said synchronizing signals.

11. An AND-OR logic circuit according to claim 7, wherein said second pull-down circuit comprises MOS transistors of the first conductivity type which are connected between the other of said power supply terminals and said output signal line and whose conduction states are controlled by the other of said synchronizing signals.

* * * * *